(12) United States Patent
Lee et al.

(10) Patent No.: US 11,680,974 B2
(45) Date of Patent: Jun. 20, 2023

(54) METHOD FOR MONITORING POLARIZATION QUALITY OF PIEZOELECTRIC FILM

(71) Applicant: CREATING NANO TECHNOLOGIES, INC., Tainan (TW)

(72) Inventors: Ji-Yung Lee, Tainan (TW); Andrew Ronaldi Tandio, Tainan (TW); Hung-Chan Chiang, Tainan (TW); Bo-Fan Tsai, Tainan (TW)

(73) Assignee: CREATING NANO TECHNOLOGIES. INC., Tainan (TW)

( * ) Notice: Subject to any disclaimer, the term of this patent is extended or adjusted under 35 U.S.C. 154(b) by 179 days.

(21) Appl. No.: 17/329,172

(22) Filed: May 25, 2021

(65) Prior Publication Data

US 2022/0003803 A1 Jan. 6, 2022

(30) Foreign Application Priority Data

Jul. 3, 2020 (TW) .................. 109122661

(51) Int. Cl.
*G01R 29/22* (2006.01)
*G01R 29/12* (2006.01)
*H10N 30/045* (2023.01)
*H10N 30/857* (2023.01)
*H10N 30/853* (2023.01)

(52) U.S. Cl.
CPC .............. *G01R 29/22* (2013.01); *G01R 29/12* (2013.01); *H10N 30/045* (2023.02); *H10N 30/857* (2023.02); *H10N 30/8554* (2023.02)

(58) Field of Classification Search
CPC ....... G01R 29/12; G01R 29/22; H01L 41/257; H01L 41/1876; H01L 41/193

USPC .......................................................... 324/133
See application file for complete search history.

(56) References Cited

U.S. PATENT DOCUMENTS

2020/0211878 A1    7/2020  Lu et al.

FOREIGN PATENT DOCUMENTS

| CN | 107104180 A | 8/2017 |
|---|---|---|
| JP | S62105926 A | 5/1987 |
| JP | 06-258216 A | 9/1994 |
| JP | 2003-098073 A | 4/2003 |
| JP | 2008196926 A | 8/2008 |

(Continued)

OTHER PUBLICATIONS

Equivalent English translation provided by (J-Plat Pat) IIDA JPH06-258216A (Year: 1994).*

(Continued)

*Primary Examiner* — Jermele M Hollington
*Assistant Examiner* — Courtney G McDonnough
(74) *Attorney, Agent, or Firm* — CKC & Partners Co., LLC

(57) ABSTRACT

A method for monitoring polarization quality of a piezoelectric film is described. In this method, a detection step is performed on a piezoelectric film by using a detection device with a non-contact method during a polarization process of the piezoelectric film, to obtain a static electricity information or a transmittance information. A determination step is performed by using the static electricity information or the transmittance information to determine a polarization degree of the piezoelectric film.

8 Claims, 9 Drawing Sheets

```
┌──────────────────────────────────────────────────┐
│ performing a detection step on a piezoelectric   │
│ film by using a non-contact method during a      │──── 100
│ polarization process of the piezoelectric film,  │
│ to obtain a static electricity information       │
└──────────────────────────────────────────────────┘
                         │
                         ▼
┌──────────────────────────────────────────────────┐
│ performing a determination step by using the     │
│ static electricity information to determine a    │──── 110
│ polarization degree of the piezoelectric film    │
└──────────────────────────────────────────────────┘
                         │
                         ▼
┌──────────────────────────────────────────────────┐
│ performing an adjustment step on process         │
│ parameters of the polarization process by a      │──── 120
│ control center according to the polarization     │
│ degree of the piezoelectric film                 │
└──────────────────────────────────────────────────┘
```

(56) References Cited

FOREIGN PATENT DOCUMENTS

| | | | |
|---|---|---|---|
| JP | 2012-103071 | A | 5/2012 |
| JP | 2016-219687 | A | 12/2016 |
| JP | 2017-152494 | A | 8/2017 |
| TW | 201930897 | A | 8/2019 |

OTHER PUBLICATIONS

Equivalent English translation provided by (J-Plat Pat) Kodama JP 2016219687 A (Year: 2016).*
Equivalent English translation provided by (J-Plat Pat) Akiyama JP 2017-152494 A (Year: 2017).*

* cited by examiner

METHOD FOR MONITORING POLARIZATION QUALITY OF PIEZOELECTRIC FILM

RELATED APPLICATIONS

This application claims priority to Taiwan Application Serial Number 109122661, filed Jul. 3, 2020, which is herein incorporated by reference.

BACKGROUND

Field of Invention

The present disclosure relates to a technique for polarizing a piezoelectric material, and more particularly, to a method for monitoring polarization quality of piezoelectric film.

Description of Related Art

Polarity directions of electrical domains in a piezoelectric material are often irregular and are counteracted with each other to make the entire piezoelectric material have no polarity easily, such that the piezoelectric property of the material cannot be presented. Thus, the piezoelectric material usually needs to undergo a polarization process to coincide the directions of the electrical domains in the piezoelectric material to present the piezoelectric property.

A non-contact polarization technique performs a polarization process by applying a high electric field to regularly arrange the molecules in the piezoelectric film along the electric field, so as to make the piezoelectric film present the piezoelectric property. The corona discharge is easily generated, and can provide a high electric field environment required by the polarization process, such that a corona discharge technique is now used to provide electrons. In some polarization apparatuses using the corona discharge technique, the electrons firstly pass through a high negative voltage grid and then arrive at a surface to be polarized.

In order to know a polarization effect of the piezoelectric film, polarization quality of the piezoelectric film is tested. In the testing of the polarization quality of the piezoelectric film, it usually needs to apply pressure to the piezoelectric film by using a detection head after the polarization process of the piezoelectric film is completed, and then a voltage value generated by the piezoelectric film after being pressed is measured.

However, such a detection method needs to be performed after the polarization process of the piezoelectric film is completed, and the polarization quality of the piezoelectric film cannot be detected online in real time during the polarization process. As a result, a polarization degree of the piezoelectric film cannot be obtained in real time during the polarization process, and thus parameters of the polarization process cannot be adjusted in real time during the polarization process, and the polarization quality of the piezoelectric film cannot be effectively enhanced.

SUMMARY

Therefore, one objective of the present invention is to provide a method for monitoring polarization quality of a piezoelectric film, which can detect the static electricity information or the transmittance information of the piezoelectric film in real time with a non-contact method during a polarization process of the piezoelectric film. An operator or a controller of an installation can determine a polarization degree of the piezoelectric film based on the static electricity information or the transmittance information. Thus, it is helpful to know an efficiency of the polarization installation and an unevenness or defects of a material to be polarized early, such that an improvement can be made as early as possible.

Another objective of the present invention is to provide a method for monitoring polarization quality of a piezoelectric film, which can determine polarization quality of the piezoelectric film during a polarization process, such that the yield of the piezoelectric film can be predicted.

Still another objective of the present invention is to provide a method for monitoring polarization quality of a piezoelectric film, which can determine a polarization degree of the piezoelectric film in real time online. Therefore, an operator or a controller of an installation can adjust parameters of a polarization process in real time according to a determining result, thereby enhancing polarization quality of the piezoelectric film.

According to the aforementioned objectives of the present invention, a method for monitoring polarization quality of a piezoelectric film is provided. In this method, a detection step is performed on a piezoelectric film by using a detection device with a non-contact method during a polarization process of the piezoelectric film, to obtain a static electricity information or a transmittance information. A determination step is performed by using the static electricity information or the transmittance information to determine a polarization degree of the piezoelectric film.

According to one embodiment of the present invention, the static electricity information includes an electrostatic value change of the piezoelectric film corresponding to a polarization time change, and performing the determination step includes using the electrostatic value change to determine the polarization degree of the piezoelectric film.

According to one embodiment of the present invention, the piezoelectric film is an organic piezoelectric film or an inorganic piezoelectric film.

According to one embodiment of the present invention, the detection device includes various electrostatic detectors, and performing the detection step includes using the electrostatic detectors to detect electrostatic values of various regions of the piezoelectric film.

According to one embodiment of the present invention, the piezoelectric film is an organic piezoelectric film or an inorganic piezoelectric film.

According to one embodiment of the present invention, the determination step includes using differences between the electrostatic values of the regions of the piezoelectric film to determine polarization quality of the piezoelectric film.

According to one embodiment of the present invention, before performing the detection step on the piezoelectric film, the method further includes using the detection device to perform a pre-process detection step to obtain an initial transmittance value of the piezoelectric film. In addition, performing the determination step further includes determining the polarization degree of the piezoelectric film based on a change trend of the initial transmittance value according to the transmittance information.

According to one embodiment of the present invention, the detection device includes a first wavelength infrared detector and a second wavelength infrared detector, and performing the detection step includes using the first wavelength infrared detector and the second wavelength infrared detector to detect the piezoelectric film simultaneously.

According to one embodiment of the present invention, the piezoelectric film is an organic piezoelectric film.

According to one embodiment of the present invention, the detection device includes various infrared detectors, and performing the detection step includes using the infrared detectors to detect transmittances of various regions of the piezoelectric film respectively.

According to one embodiment of the present invention, the piezoelectric film is an organic piezoelectric film.

According to one embodiment of the present invention, the determination step includes using differences between the transmittances of the regions of the piezoelectric film to determine polarization quality of the piezoelectric film.

According to one embodiment of the present invention, after the detection step is performed, the method further includes transferring the static electricity information or the transmittance information of the piezoelectric film to a control center, and the control center performs the determination step according to the static electricity information or the transmittance information.

According to one embodiment of the present invention, the control center performs an adjustment step on at least one process parameter of the polarization process according to the polarization degree of the piezoelectric film.

According to one embodiment of the present invention, performing the adjustment step includes adjusting a polarization voltage of the polarization process and/or adjusting a polarization time of the piezoelectric film during the polarization process.

BRIEF DESCRIPTION OF THE DRAWINGS

The aforementioned and other objectives, features, advantages and examples of invention can be more fully understood by reading the following detailed description of the embodiment, with reference made to the accompanying drawings as follows.

DETAILED DESCRIPTION

Figure 1:
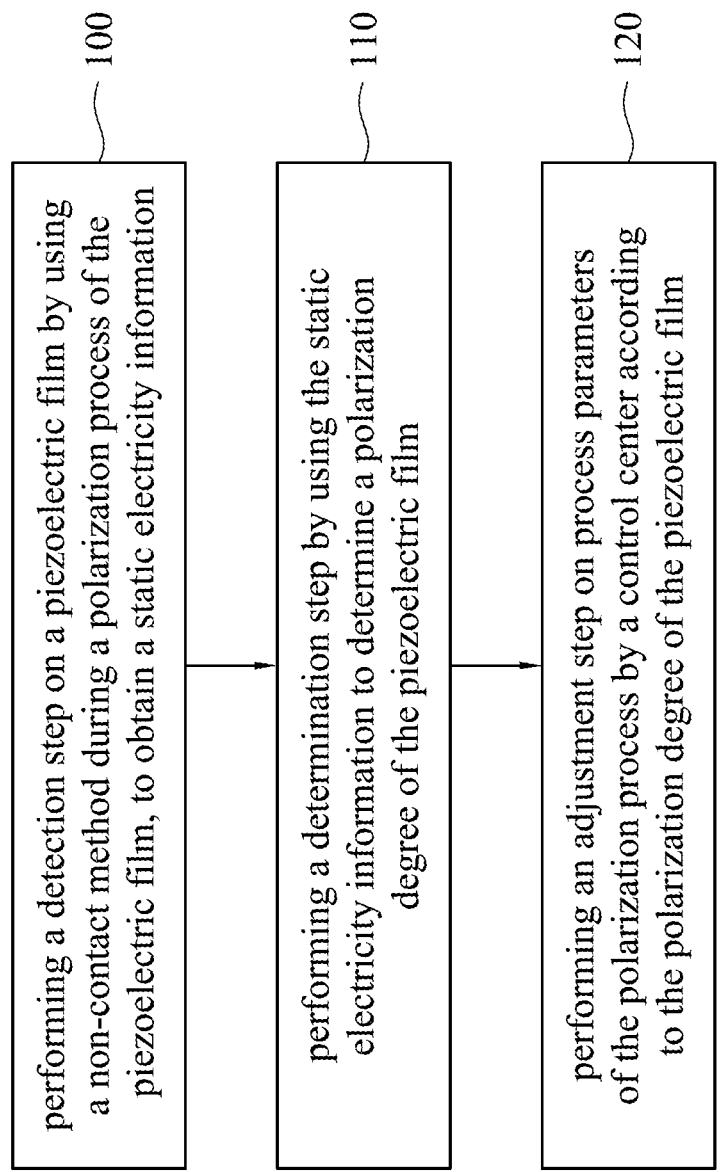
FIG. 1 is a flowchart of a method for monitoring polarization quality of a piezoelectric film in accordance with one embodiment of the present invention.
Figure 2:
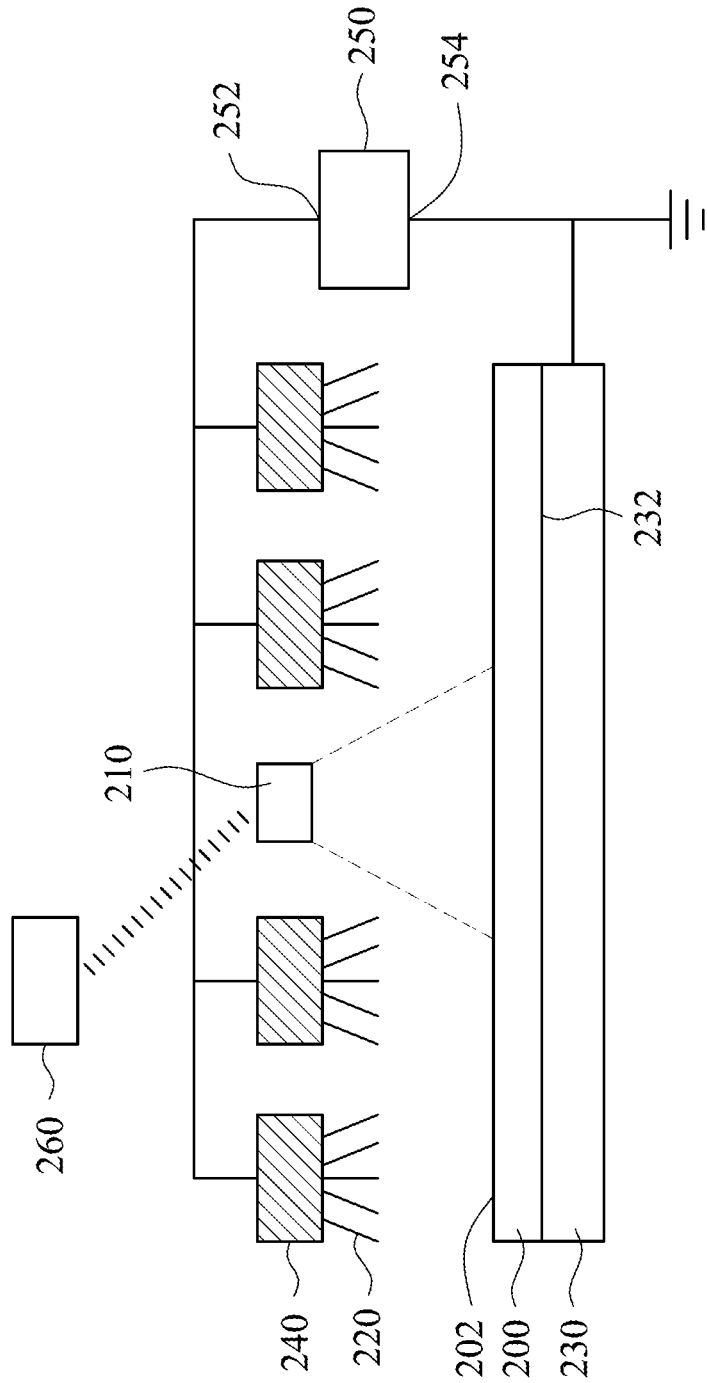
FIG. 2 is a schematic diagram of an installation for monitoring polarization quality of a piezoelectric film in accordance with a first embodiment of the present invention.

Referring to FIG. 1 and FIG. 2, FIG. 1 and FIG. 2 are respectively a flowchart of a method for monitoring polarization quality of a piezoelectric film in accordance with one embodiment of the present invention, and a schematic diagram of an installation for monitoring polarization quality of a piezoelectric film in accordance with a first embodiment of the present invention. In the present embodiment, in monitoring of a piezoelectric film, a step 100 may be performed firstly, to perform a detection step on a piezoelectric film 200 by using a detection device 210 with a non-contact method during a polarization process of the piezoelectric film 200, so as to obtain the information of physical properties of the piezoelectric film 200. For example, the detection device 210 may be an electrostatic detector, which can detect a static electricity information of a surface 202 of the piezoelectric film 200. The piezoelectric film 200 may be an organic piezoelectric film, such as polyvinylidene difluoride (PVDF) and other polymer piezoelectric materials, or may be an inorganic piezoelectric film, such as lead zirconate titanate (PZT) and other piezoelectric ceramic materials.

In some examples, the polarization process may be performed by using plasma 220. As shown in FIG. 2, in the performing of the polarization process, the piezoelectric film 200 is disposed on a surface 232 of a conductive substrate 230, and one or more electrodes 240 are disposed over the piezoelectric film 200. The conductive substrate 230 is grounded. A first electrode 252 of a power supply 250 is electrically connected to the electrodes 240, and a second electrode 254 of the power supply 250 is grounded. The detection device 210 is arranged at a place where the detection device 210 can scan the surface 202 of the piezoelectric film 200. For example, the detection device 210 may be disposed between the electrodes 240, but the detection device 210 and the surface 202 of the piezoelectric film 200 is not blocked by the electrodes 240.

In the present embodiment, when the piezoelectric film 200 is polarized back and forth with the plasma 220, the detection device 210 can scan and measure the static electricity information on the surface 202 of the piezoelectric film 200 in real-time online with a non-contact manner. In some examples, when the piezoelectric film 200 is not yet polarized, an electrostatic value of the surface 202 of the piezoelectric film 200 is low, and may be 0, for example. As the polarization process progresses, the electrostatic value of the surface 202 of the piezoelectric film 200 changes. Therefore, during the polarization process, the electrostatic value of the surface 202 of the piezoelectric film 200 is measured and recorded by using the detection device 210 in real time.

Figure 3:
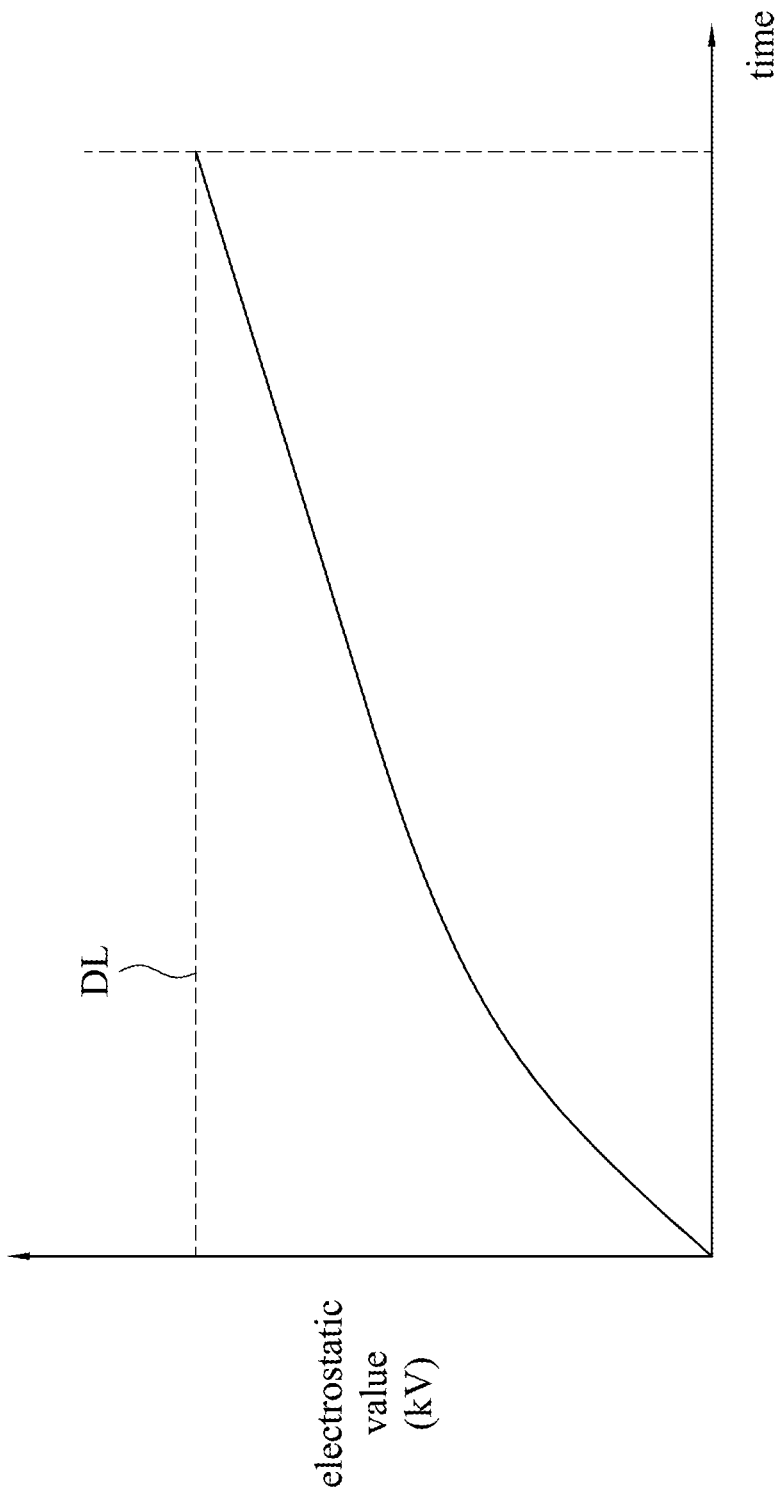
FIG. 3 is a graph showing a relationship between the electrostatic value of a surface of a piezoelectric film and the polarization time in accordance with a first embodiment of the present invention.

Referring to FIG. 3, FIG. 3 is a graph showing a relationship between the electrostatic value of a surface of a piezoelectric film and the polarization time in accordance with a first embodiment of the present invention. It can be seen from FIG. 3 that the electrostatic value of the surface 202 of the piezoelectric film 200 increases as the polarization time increases. By detecting the change in the electrostatic value of the surface 202 of the piezoelectric film 200 during the polarization process, a polarization degree of the piezoelectric film 200 can be estimated and process quality can be identified without damaging the piezoelectric film 200.

Then, a step 110 may be performed to use the detected static electricity information of the piezoelectric film 200 to determine the polarization degree of the piezoelectric film 200. In some examples, the static electricity information of the piezoelectric film 200 includes an electrostatic value change of the surface 202 of the piezoelectric film 200 corresponding to a polarization time change. The electrostatic value change may be used to determine the polarization degree of the piezoelectric film 200.

In some exemplary examples, the detection device 210 may transmit the measured static electricity information of the piezoelectric film 200 to a control center 260 through a wired transmission method or a wireless transmission method. The control center 260 can update the graph or database according to the received static electricity information. The control center 260 can set a qualification threshold, such as a horizontal dashed line DL in FIG. 3, based on the data recorded in the past or by calculation, which can help a control system or an operator of the control center 260 to determine whether the polarization quality of the piezoelectric film 200 has reached a desired requirement at the predetermined end of the polarization process.

If the polarization quality of the piezoelectric film 200 does not meet the desired requirement, the control center 260 may proceed to a step 120 to adjust one or more process parameters of the polarization process according to the determined polarization degree of the piezoelectric film 200. For example, the control center 260 may adjust a polarization voltage of the polarization process to adjust a polarization power and/or adjust a polarization time of the piezoelectric film 200 during the polarization process of the piezoelectric film 200. In some exemplary examples, the polarization time of the piezoelectric film 200 may be adjusted by adjusting a production line speed of a roll-to-roll (RTR) polarization process or an in-line polarization process, or by adjusting a polarization processing time of a batch polarization process.

Figure 4:
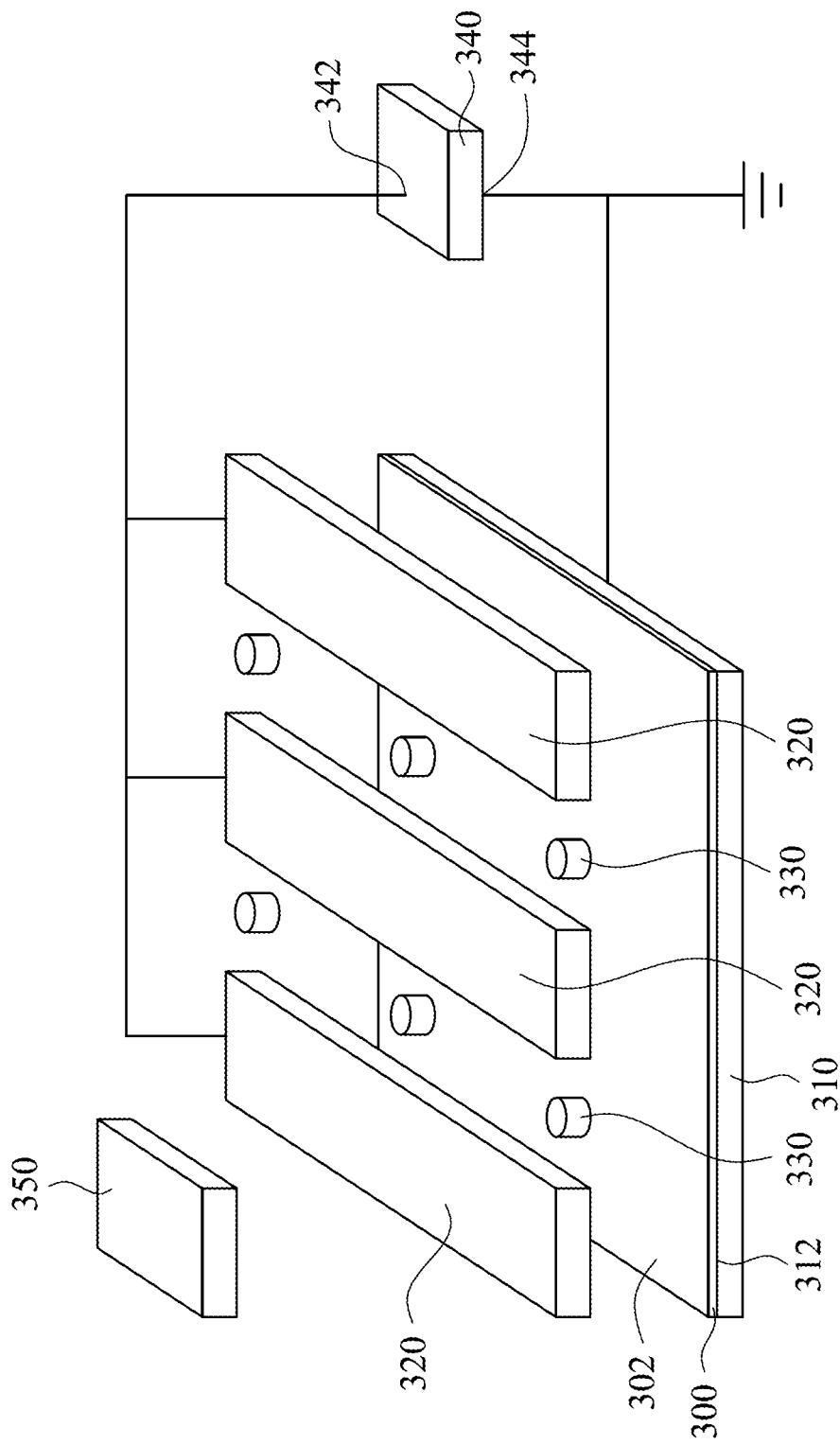
FIG. 4 is a schematic diagram of an installation for monitoring polarization quality of a piezoelectric film in accordance with a second embodiment of the present invention.

For a polarization process of a large-area piezoelectric film, a polarization degree and polarization uniformity of the piezoelectric film is a key to the polarization quality. Referring to FIG. 4, FIG. 4 is a schematic diagram of an installation for monitoring polarization quality of a piezoelectric film in accordance with a second embodiment of the present invention. In the present embodiment, plasma is also used to perform a polarization process on a piezoelectric film 300. The piezoelectric film 300 may be an organic piezoelectric film or an inorganic piezoelectric film. The piezoelectric film 300 is disposed on a surface 312 of a conductive substrate 310. In some examples, the piezoelectric film 300 is a large-area film, so several electrodes 320 are arranged above a surface 302 of the piezoelectric film 300. The electrodes 320 may be arranged at a certain interval, for example. Various detection devices 330 are arranged at locations where the detection devices 330 can scan the surface 302 of the piezoelectric film 300. For example, one or more detection devices 330 may be arranged between two adjacent electrodes 320. The detection device 330 may also be an electrostatic detector, which can detect a static electricity information on the surface 302 of the piezoelectric film 300. The conductive substrate 310 is grounded. A first electrode 342 of a power supply 340 is electrically connected to the electrodes 320, and a second electrode 344 of the power supply 340 is grounded.

In the monitoring of polarization quality of the piezoelectric film 300, a detection step may be performed on various regions of the piezoelectric film 300 by respectively using the detection devices 330 during a polarization process of the piezoelectric film 300, so as to obtain the static electricity information of the regions of the surface 302 of the piezoelectric film 300, such as electrostatic values, or electrostatic value changes corresponding to polarization time changes. The installation of the detection devices 330 can increase a detection area and be helpful to know a static electricity distribution in different regions of the piezoelectric film 330. The detection devices 330 can independently detect and record the electrostatic values within their measuring ranges.

Figure 5:
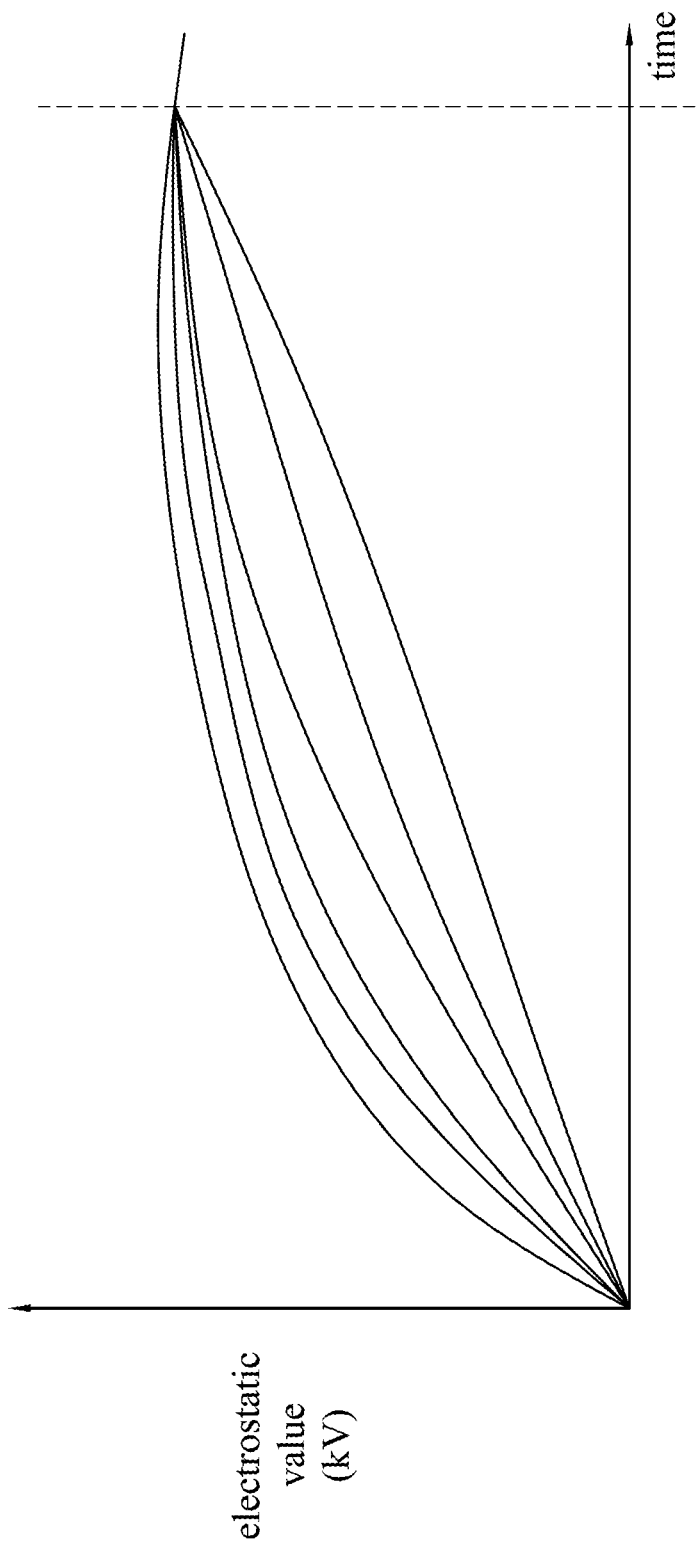
FIG. 5 is a graph showing a relationship between the electrostatic value of a surface of a piezoelectric film and the polarization time in accordance with a second embodiment of the present invention.

Referring to FIG. 5, FIG. 5 is a graph showing a relationship between the electrostatic value of a surface of a piezoelectric film and the polarization time in accordance with a second embodiment of the present invention. It can be seen from FIG. 5 that the electrostatic values of the various regions of the surface 302 of the piezoelectric film 300 measured by the detection devices 330 are all increased with the increase of the polarization time. Each curve in FIG. 5 can have a different rising speed or a different saturation value, and observing the differences between these curves can be helpful to understand the efficiency of the polarization installation and/or the uniformity or defects of the piezoelectric material to be polarized, and also can be used to predict the product yield of the piezoelectric film 300. For example, the differences between the electrostatic values of these regions of the piezoelectric film 300 may be used to determine the polarization quality of the piezoelectric film 300, such as the polarization uniformity of the piezoelectric film 300. Therefore, the polarization degree of the piezoelectric film 300 can be inferred and the quality of the process can be identified by detecting changes in the electrostatic value of the various regions of the surface 302 of the piezoelectric film 300 during the polarization process.

In some exemplary examples, the detection devices 330 may transmit the measured static electricity information of the regions of the piezoelectric film 300 to a control center 350 through a wired transmission method or a wireless transmission method. The control center 350 can update the graph or database according to the received static electricity information. A control system or an operator of the control center 350 can determine whether the polarization quality of the regions of the piezoelectric film 300 has reached a desired requirement at the predetermined end of the polarization process based on the static electricity information.

If it is found that several or all of the curves have not reached the desired quality requirement according to the static electricity information, for example, according to the graph of FIG. 5, it means that the polarization degree and/or the polarization uniformity of the piezoelectric film 300 has not met the quality requirement. At this time, the control center 350 can adjust one or more process parameters of the polarization process according to the determined polarization degree and polarization uniformity of the piezoelectric film 300. For example, the control center 350 may adjust a polarization voltage of the polarization process to adjust a polarization power and/or adjust a polarization time of the piezoelectric film 300 during the polarization process of the piezoelectric film 300.

Figure 6:
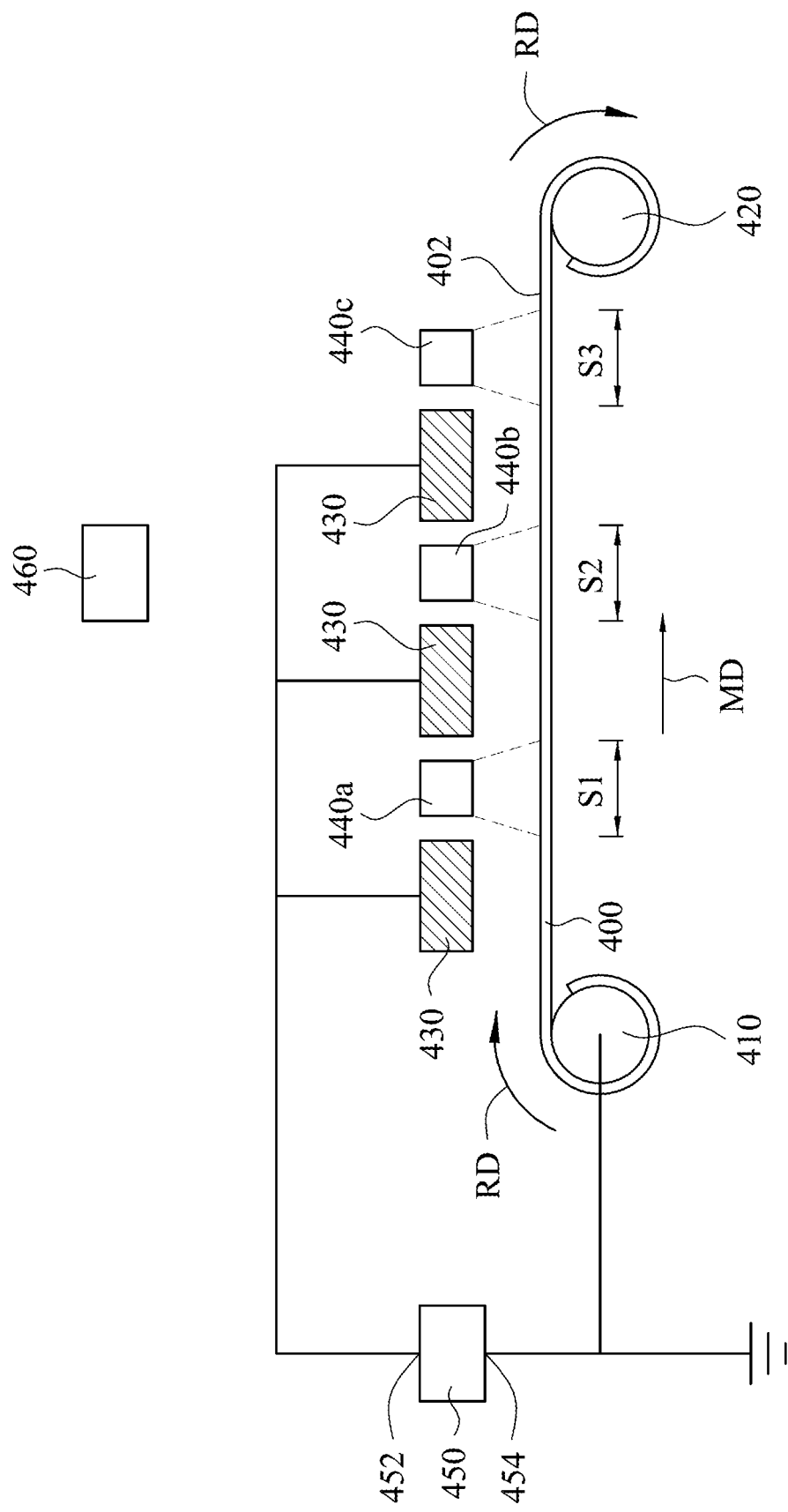
FIG. 6 is a schematic diagram of an installation for monitoring polarization quality of a piezoelectric film in accordance with a third embodiment of the present invention.

Referring to FIG. 6, FIG. 6 is a schematic diagram of an installation for monitoring polarization quality of a piezoelectric film in accordance with a third embodiment of the present invention. The installation of the present embodiment is an application of multi-point detection in a roll-to-roll polarization process or an in-line polarization process of a piezoelectric film 400. In the present embodiment, plasma is used to perform a polarization process on the piezoelectric film 400. The piezoelectric film 400 may be an organic piezoelectric film or an inorganic piezoelectric film. The piezoelectric film 400 is a continuous film, and the polarization process is performed on the piezoelectric film 400 by using a roll-to-roll method.

The polarization installation includes a first roller 410 and a second roller 420. The piezoelectric film 400 may be wound on and carried by the first roller 410, and the first roller 410 may rotate in a direction RD. The direction RD may be clockwise or counterclockwise. The first roller 410 may drive the piezoelectric film 400 while rotating. In the present embodiment, the first roller 410 is made of a conductive material, and the first roller 410 may be grounded. The continuous piezoelectric film 400 from the roller 410 may be received by and wound on the second roller 420. The second roller 420 may also rotate in the direction RD. While the second roller 420 rotates, the piezoelectric film 400 from the first roller 410 may be received by and wound on the second roller 420, so as to achieve a roll-to-roll continuous polarization process.

Various electrodes 430 are arranged between the first roller 410 and the second roller 420. These electrodes 430 are located above a movement path of the piezoelectric film 400 between the first roller 410 and the second roller 420 to form plasma to polarize the piezoelectric film 400 passing through. For example, the electrodes 430 may be arranged at a certain interval. A first electrode 452 of a power supply 450 is electrically connected to the electrodes 430, and a second electrode 454 of the power supply 450 is grounded.

Several detection devices 440a, 440b, and 440c are disposed between the first roller 410 and the second roller 420, and are located at positions where the detection devices 440a, 440b, and 440c can scan a surface 402 of the piezoelectric film 400. For example, along a movement direction MD of the piezoelectric film 400, the detection devices 440a, 440b, and 440c may be arranged in sequence, and one of the detection devices 440a, 440b, and 440c may be located behind each of the electrodes 430. The detection devices 440a, 440b, and 440c may also be electrostatic detectors, which can detect a static electricity information of the surface 402 of the piezoelectric film 400.

In the monitoring of polarization quality of the piezoelectric film 400, a detection step may be performed on the portions of the piezoelectric film 400 sequentially passing through by using the detection devices 440a, 440b, and 440c during the polarization process of the piezoelectric film 400, so as to obtain the static electricity information of the surface 402 of the piezoelectric film 400 after the polarization treatment with different polarization time, such as an electrostatic value, or an electrostatic value change corresponding to a period of polarization time change.

The piezoelectric film 400 to be polarized continues to move in a roll-to-roll continuous state, so the polarization time and the travel speed of the piezoelectric film 400 are not the most critical observation factors. Therefore, the electrostatic values on the surface 402 of the piezoelectric film 400 after different degrees of polarization are detected by arranging the detecting devices 440a, 440b, and 440c at different positions above a travel path of the piezoelectric film 400. The detection device 440a is located at the most upstream position, and the piezoelectric film 400 passing through a detectable section S1 has the lowest polarization degree. The detection device 440b is located at the middle position, and a polarization degree of the piezoelectric film 400 passing through a detectable section S2 is greater than that in the section S1. The detection device 440c is located at the most downstream position, and the piezoelectric film 400 passing through a detectable section S3 has the highest polarization degree.

Figure 7:
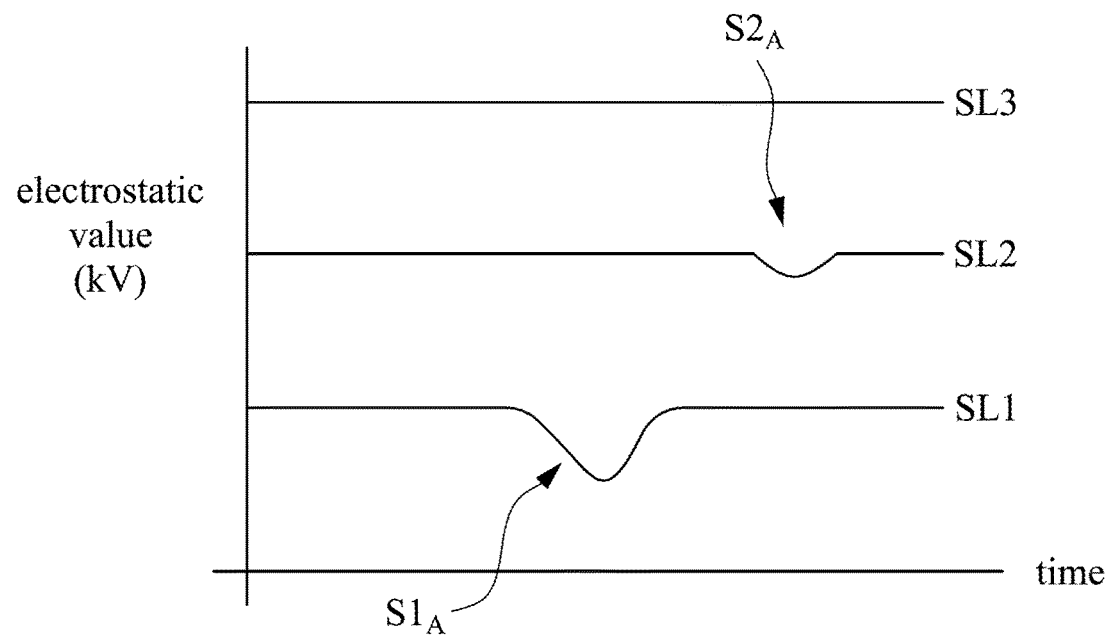
FIG. 7 is a graph showing a relationship between the electrostatic value of a surface of a piezoelectric film and the polarization time in accordance with a third embodiment of the present invention.

Referring to FIG. 7, FIG. 7 is a graph showing a relationship between the electrostatic value of a surface of a piezoelectric film and the polarization time in accordance with a third embodiment of the present invention. It can be seen from curves SL1, SL2, and SL3 in FIG. 7 that the electrostatic values of the surface 402 of the piezoelectric film 400 measured by the detection devices 440a, 440b, and 440c are increased with the increase in the polarization degree. That is, the polarization degrees of the piezoelectric film 400 passing through the sections S1, S2, and S3 are increased in sequence, such that the electrostatic values measured by the detection devices 440a, 440b, and 440c in the corresponding sections S1, S2, and S3 are also sequentially increased.

The stability of the polarization process of the piezoelectric film 400 can be determined by observing the changes of the curves SL1, SL2, and SL3 in FIG. 7. For example, these detecting devices 440a, 440b, and 440c are arranged at different positions on the travel path of the piezoelectric film 400, the electrostatic values measured by the detection devices 440a, 440b, and 440c in the corresponding sections S1, S2, and S3 should not be increased with time, but should be within an acceptable range. However, in FIG. 7, during the time period $S1_A$ of the curve SL1, various process instability factors, such as electrode failure, material defects or unevenness of the piezoelectric film 400, etc., may cause the electrostatic value to be lower than a normal range. In other examples, due to the unstable factors of the polarization process, the measured electrostatic value may also be higher than the normal range.

In some exemplary examples, the detection devices 440a, 440b, and 440c may transmit the measured static electricity information of the piezoelectric film 400 to a control center 460 through a wired transmission method or a wireless transmission method. The control center 460 can update the graph or database according to the received static electricity information. A control system or an operator of the control center 460 can determine the stability of the polarization process of the piezoelectric film 400 based on the static electricity information.

When it is found that the curves SL1, SL2, and SL3 have changed according to the static electricity information, for example, according to the graph in FIG. 7, it means that the polarization process is unstable. For example, the electrostatic value of the piezoelectric film 400 in the period $S1_A$ of the curve SL1 is lower than the normal range, the control center 460 can adjust the next electrode 430, i.e. the electrode 430 between the detection devices 440a and 440b, so as to reduce the instability of the polarization process. After adjusting, the electrostatic value of the piezoelectric film 400 during the period $S2_A$ of the curve SL2 has been increased, which indicates that the instability of the process has been greatly improved. The control center 460 can perform an adjustment measures for the next electrode 430 again, i.e. the electrode 430 between the detection devices 440b and 440c, such that the polarization degree of the roll of the piezoelectric film 400 is completely improved when piezoelectric film 400 reaches the section S3, and thus the detected electrostatic value is stable within a qualified range.

The polarization can change the crystal phase of the organic piezoelectric material film, such that infrared rays may be used to analyze and detect the polarization process of the organic piezoelectric material film. Therefore, other embodiments of the present invention may use infrared detectors to replace the static detectors used in the above embodiments. In one embodiment, referring to FIG. 2 again, the detecting device 210 may be an infrared detector. An infrared detector is used as the detection device 210 to detect the piezoelectric film 200 by a non-contact method during the polarization process of the piezoelectric film 200, so as to obtain a transmittance information of the piezoelectric film 200. In this embodiment, the piezoelectric film 200 may be an organic piezoelectric film, such as polyvinylidene difluoride and other polymer piezoelectric materials.

In the present embodiment, when plasma is used to perform a polarization process on the piezoelectric film 200 back and forth, the detection device 210 can scan and measure the transmittance information of the piezoelectric film 200 in real time online. There is a change between the transmittance curve of the piezoelectric film 200 when it is not polarized and the transmittance curve of the polarized piezoelectric film 200. Therefore, in polarizing, the transmittance of the piezoelectric film 200 is measured and recorded in real time by using the detection device 210. The detection device 210 may transmit the measured transmittance information of the piezoelectric film 200 to the control center 260 through a wired transmission method or a wireless transmission method. The control center 260 can update the graph or database according to the received transmittance information.

Figure 8:
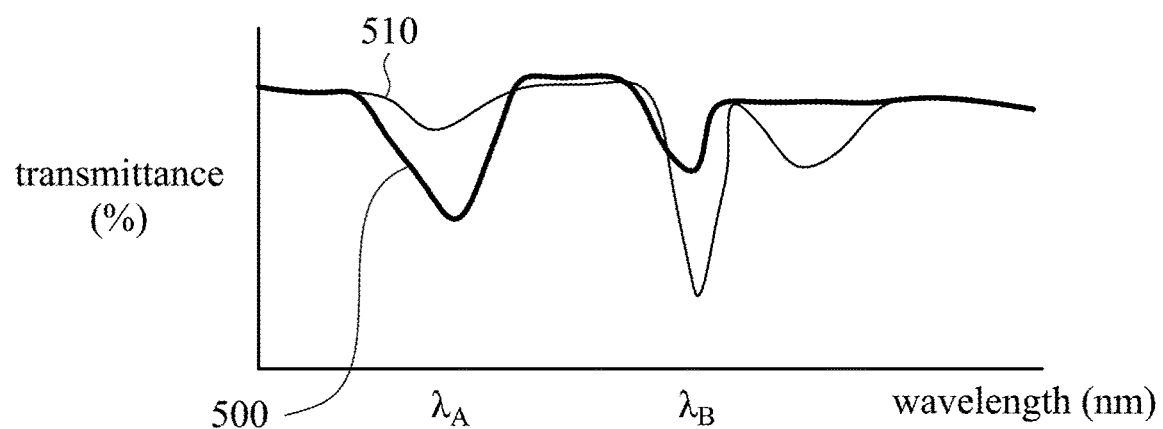
FIG. 8 is a graph showing a transmittance spectrum of a piezoelectric film in accordance with a fourth embodiment of the present invention.

Referring to FIG. 8, FIG. 8 is a graph showing a transmittance spectrum of a piezoelectric film in accordance with a fourth embodiment of the present invention, in which a horizontal axis is the infrared wavelength, and a vertical axis is the transmittance of the piezoelectric film. It can be seen from FIG. 8 that there are changes between a transmittance spectrum curve 510 of the piezoelectric film 200 that has not been polarized and a transmittance spectrum curve 500 of the piezoelectric film 200 that have been polarized under the infrared light wavelengths $\lambda_A$ and $\lambda_B$. In the present embodiment, the change range between the non-polarized and polarized transmittance spectrum curves 510 and 500 of the piezoelectric film 200 may be used as quantitative analysis data to infer the polarization degree of the piezoelectric film 200 and to identify the quality of the process.

In some examples, before the detection step is performed on the piezoelectric film 200, the infrared detection device 210 may be used to perform a pre-process detection step, so as to obtain an initial transmittance value of the piezoelectric film 200. For example, the initial transmittance value of the piezoelectric film 200 may be the transmittance of the piezoelectric film 200 without being polarized. In the determining of the polarization degree of the piezoelectric film 200, the control center 260 may determine the polarization degree of the piezoelectric film 200 based on a change trend of the initial transmittance value according to the transmittance information detected by the detection device 210 during the polarization process.

In the example shown in FIG. 8, when the infrared wavelength is $\lambda_A$, the transmittance of the piezoelectric film 200 after being polarized is lower than that before polarization. When the infrared wavelength is $\lambda_B$, the transmittance of the piezoelectric film 200 after being polarized is higher than that before polarization. Thus, in the present embodiment, when detecting the polarization quality of the piezoelectric film 200, an infrared detector with one wavelength or various infrared detectors with more than two wavelengths may be used to simultaneously observe the quality of the polarization process of the piezoelectric film 200, for example, the polarization degree, uniformity, and stability of the piezoelectric film 200.

Figure 9:
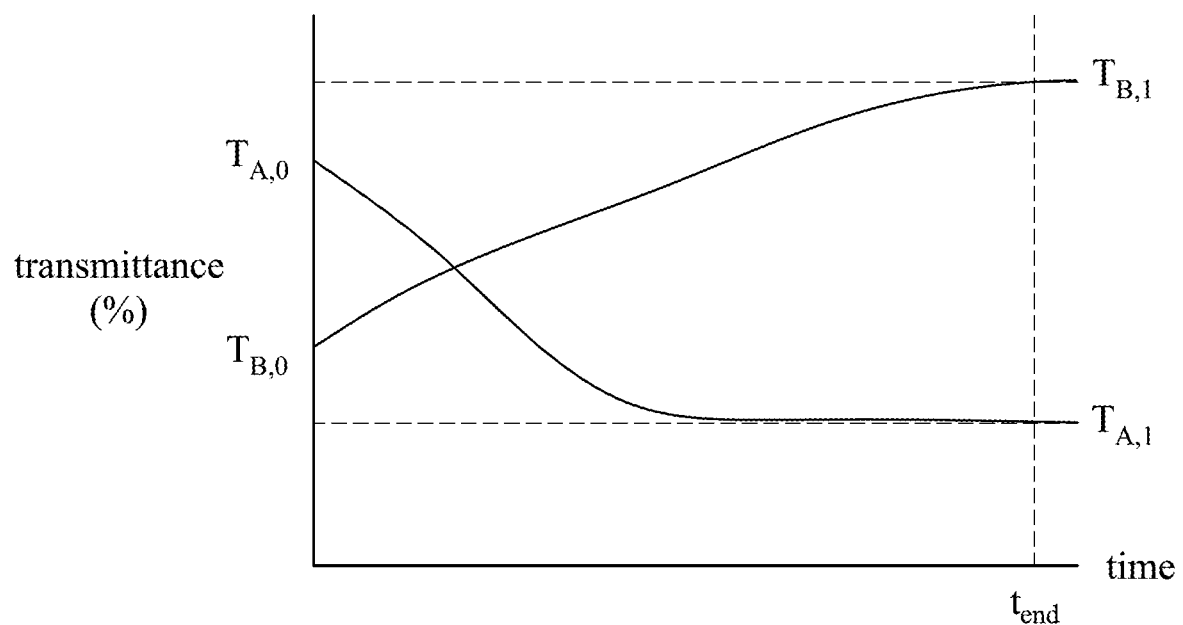
FIG. 9 is a graph showing a relationship between the transmittance of a piezoelectric film and the polarization time in accordance with a fifth embodiment of the present invention.

For a batch-type polarization installation, the control system or the operator of the control center 260 may set polarization qualification standards of the piezoelectric film 200 under infrared lights with specific wavelengths based on past experimental data. Referring to FIG. 9, FIG. 9 is a graph showing a relationship between the transmittance of a piezoelectric film and the polarization time in accordance with a fifth embodiment of the present invention. As shown in FIG. 9, the qualification standard for the polarization of the piezoelectric film may be set as the transmittance of the piezoelectric film is $T_{A,1}$ when the infrared wavelength is $\lambda_A$; and the transmittance of the piezoelectric film is $T_{B,1}$ when the infrared wavelength is $\lambda_B$. Before the polarization process of the piezoelectric film, the infrared transmittance of the piezoelectric film is $T_{A,0}$ measured when the infrared wavelength is $\lambda_A$, and the infrared transmittance of the piezoelectric film is $T_{B,0}$ measured when the infrared wavelength is $\lambda_B$. During the polarization process of the piezoelectric film, the infrared detector continuously detects the transmittance of the piezoelectric film under the infrared wavelengths $\lambda_A$ and $\lambda_B$. If the piezoelectric film has met two eligibility standards, that is the transmittance of the piezoelectric film is $T_{A,1}$ when detected by the infrared wavelength $\lambda_A$ and the transmittance of the piezoelectric film is $T_{B,1}$ when detected by the infrared wavelength $\lambda_B$ at time $t_{end}$, the polarization process of the piezoelectric film ban be stopped.

Referring to FIG. 4 again, the detection devices 330 may be infrared detectors to simultaneously detect the transmittance of various regions of the piezoelectric film. Thus, the control center 350 can use the differences between the transmittances of these regions of the piezoelectric film 300 to determine the polarization quality of the piezoelectric film 300, such as the polarization uniformity of the piezoelectric film 300. Accordingly, the polarization degree of the piezoelectric film 300 can be inferred and the quality of the process can be identified by detecting changes in the transmittance of the various regions of the piezoelectric film 300 during the polarization process.

Referring to FIG. 6 again, the detection devices 440a, 440b, and 440c may also be infrared detectors. The detection devices 440a, 440b, and 440c may be set at different positions over the travel path of the piezoelectric film 400 to detect the transmittance of the piezoelectric film 400 after different degrees of polarization.

Figure 10:
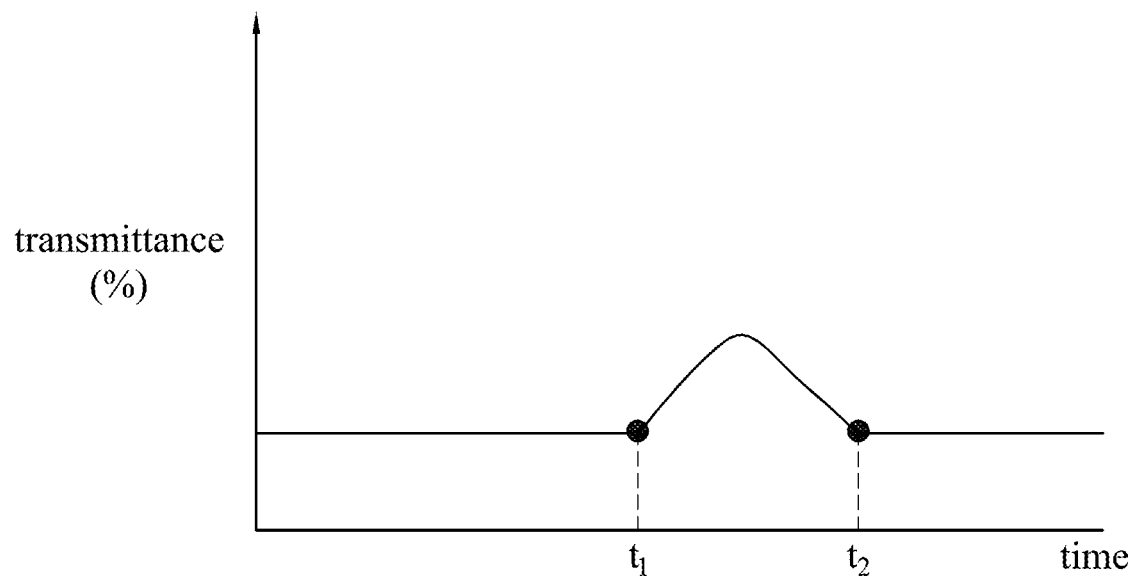
FIG. 10 is a graph showing a relationship between the transmittance of a piezoelectric film and the polarization time detected under an infrared wavelength $\lambda_A$ in accordance with a sixth embodiment of the present invention.
Figure 11:
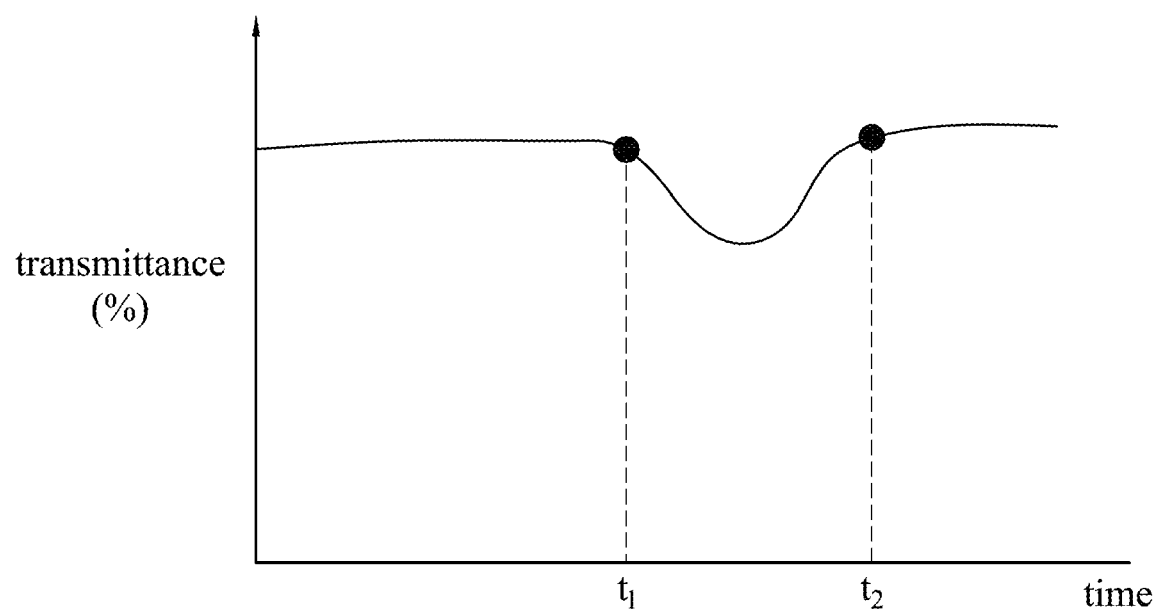
FIG. 11 is a graph showing a relationship between the transmittance of a piezoelectric film and the polarization time detected under an infrared wavelength $\lambda_B$ in accordance with a sixth embodiment of the present invention.

Referring to FIG. 10 and FIG. 11, FIG. 10 and FIG. 11 are graphs showing relationships between the transmittance of a piezoelectric film and the polarization time respectively detected under infrared wavelengths $\lambda_A$ and $\lambda_B$ in accordance with a sixth embodiment of the present invention. As shown in FIG. 10 and FIG. 11, during the polarization process of the piezoelectric film, when infrared detectors with infrared wavelengths of $\lambda_A$ and $\lambda_B$ are used to detect the transmittance of the piezoelectric film, the transmittance of the piezoelectric film begins to change at time $t_1$. For example, the transmittance of the piezoelectric film detected by the infrared detector with the infrared wavelength of $\lambda_A$ begins to increase at time $t_1$, and the transmittance of the piezoelectric film detected by the infrared detector with the infrared wavelength of $\lambda_B$ begins to decrease at time $t_1$. At this time, when the control center receives the transmittance information of the piezoelectric film from the infrared detector, the control center can determine the polarization process according to the change in the transmittance of the piezoelectric film, and can further adjust the process parameters of the polarization process to improve the quality of the polarization process. After adjusting the process parameters of the polarization process, at time $t_2$, the transmittance of the piezoelectric film detected by the infrared detector with the infrared wavelength of $\lambda_A$ and the transmittance of the piezoelectric film detected by the infrared detector with the infrared wavelength of $\lambda_B$ both have returned to a stable qualified range.

According to the aforementioned embodiments, one advantage of the present invention is that a method for monitoring polarization quality of a piezoelectric film of the present invention can detect a static electricity information or a transmittance information of the piezoelectric film in real time with a non-contact method during a polarization process of the piezoelectric film. An operator or a controller of an installation can determine a polarization degree of the piezoelectric film based on the static electricity information or the transmittance information. Therefore, it can help to know an efficiency of the polarization installation and an unevenness or defects of a material to be polarized early, such that an improvement can be made as early as possible.

According to the aforementioned embodiments, another advantage of the present invention is that a method for monitoring polarization quality of a piezoelectric film of the present invention can determine polarization quality of the piezoelectric film during a polarization process, such that the yield of the piezoelectric film can be predicted.

According to the aforementioned embodiments, still another advantage of the present invention is that a method for monitoring polarization quality of a piezoelectric film of the present invention can determine a polarization degree of the piezoelectric film in real time online. Therefore, an operator or a controller of an installation can adjust parameters of a polarization process in real time according to a determining result, thereby enhancing polarization quality of the piezoelectric film.

Although the present invention has been described in considerable detail with reference to certain embodiments thereof, the foregoing embodiments of the present invention are illustrative of the present invention rather than limiting of the present invention. It will be apparent to those having ordinary skill in the art that various modifications and variations can be made to the present invention without departing from the scope or spirit of the invention. Therefore, the spirit and scope of the appended claims should not be limited to the description of the embodiments contained herein.

What is claimed is:

1. A method for monitoring polarization quality of a piezoelectric film, comprising:
    using a detection device to perform a pre-process detection step on a piezoelectric film to obtain an initial transmittance value of the piezoelectric film;
    performing a detection step on the piezoelectric film by using the detection device with a non-contact method during a polarization process of the piezoelectric film, to obtain a transmittance information, wherein the detection device comprises a first wavelength infrared detector and a second wavelength infrared detector, and performing the detection step comprises using the first wavelength infrared detector and the second wavelength infrared detector to detect the piezoelectric film simultaneously; and
    performing a determination step by using the transmittance information to determine a polarization degree of the piezoelectric film, wherein performing the determination step further comprises determining the polarization degree of the piezoelectric film based on a change trend of the initial transmittance value according to the transmittance information.

2. The method of claim 1, wherein the piezoelectric film is an organic piezoelectric film.

3. The method of claim 1, wherein the detection device further comprises a plurality of infrared detectors, and performing the detection step comprises using the infrared detectors to detect a plurality of transmittances of a plurality of regions of the piezoelectric film respectively.

4. The method of claim 3, wherein the piezoelectric film is an organic piezoelectric film.

5. The method of claim 3, wherein the determination step comprises using differences between the transmittances of the regions of the piezoelectric film to determine polarization quality of the piezoelectric film.

6. The method of claim 1, wherein after the detection step is performed, the method further comprises transferring the transmittance information of the piezoelectric film to a control center, and the control center performs the determination step according to the transmittance information.

7. The method of claim 6, wherein the control center performs an adjustment step on at least one process parameter of the polarization process according to the polarization degree of the piezoelectric film.

8. The method of claim 7, wherein performing the adjustment step comprises adjusting a polarization voltage of the polarization process and/or adjusting a polarization time of the piezoelectric film during the polarization process.

* * * * *